(12) United States Patent
Fujiwara et al.

(10) Patent No.: US 11,183,260 B1
(45) Date of Patent: Nov. 23, 2021

(54) TRANSMIT LINE MONITORING CIRCUITRY, AND RELATED METHODS, DEVICES, AND SYSTEMS

(71) Applicant: Micron Technology, Inc., Boise, ID (US)

(72) Inventors: Yoshinori Fujiwara, Boise, ID (US); Dave Jefferson, Boise, ID (US); Jason M. Johnson, Boise, ID (US); Vivek Kotti, Boise, ID (US); Minoru Someya, Tokyo (JP); Toru Ishikawa, Tokyo (JP); Kevin G. Werhane, Kuna, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 17/098,865

(22) Filed: Nov. 16, 2020

(51) Int. Cl.
*G11C 29/14* (2006.01)
*G11C 29/46* (2006.01)
*G11C 17/16* (2006.01)
*G11C 7/10* (2006.01)

(52) U.S. Cl.
CPC .............. *G11C 29/14* (2013.01); *G11C 7/106* (2013.01); *G11C 7/1087* (2013.01); *G11C 17/16* (2013.01); *G11C 29/46* (2013.01)

(58) Field of Classification Search
CPC ...... G11C 17/14; G11C 17/143; G11C 17/146; G11C 17/16; G11C 17/165
See application file for complete search history.

(56) References Cited

U.S. PATENT DOCUMENTS

| | | | |
|---|---|---|---|
| 2001/0026483 A1* | 10/2001 | Hasegawa | G11C 11/4097 365/200 |
| 2010/0157704 A1* | 6/2010 | Iwaki | G11C 29/84 365/200 |
| 2012/0096314 A1* | 4/2012 | Motika | G06F 11/27 714/30 |

* cited by examiner

*Primary Examiner* — Han Yang
(74) *Attorney, Agent, or Firm* — TraskBritt

(57) ABSTRACT

Memory devices are disclosed. A memory device may include a number of fuses and a number of transmit lines configured to transmit data from the number of fuses. The memory device may also include a number of monitoring circuits. Each monitoring circuit of the number of monitoring circuits is coupled to a transmit line of the number of transmit lines. Each monitoring circuit comprises logic configured to receive the data from the number fuses via the transmit line. The logic is further configured to generate a result responsive to the data and indicative of pass/fail status of the transmit line. Associated methods and systems are also disclosed.

20 Claims, 12 Drawing Sheets

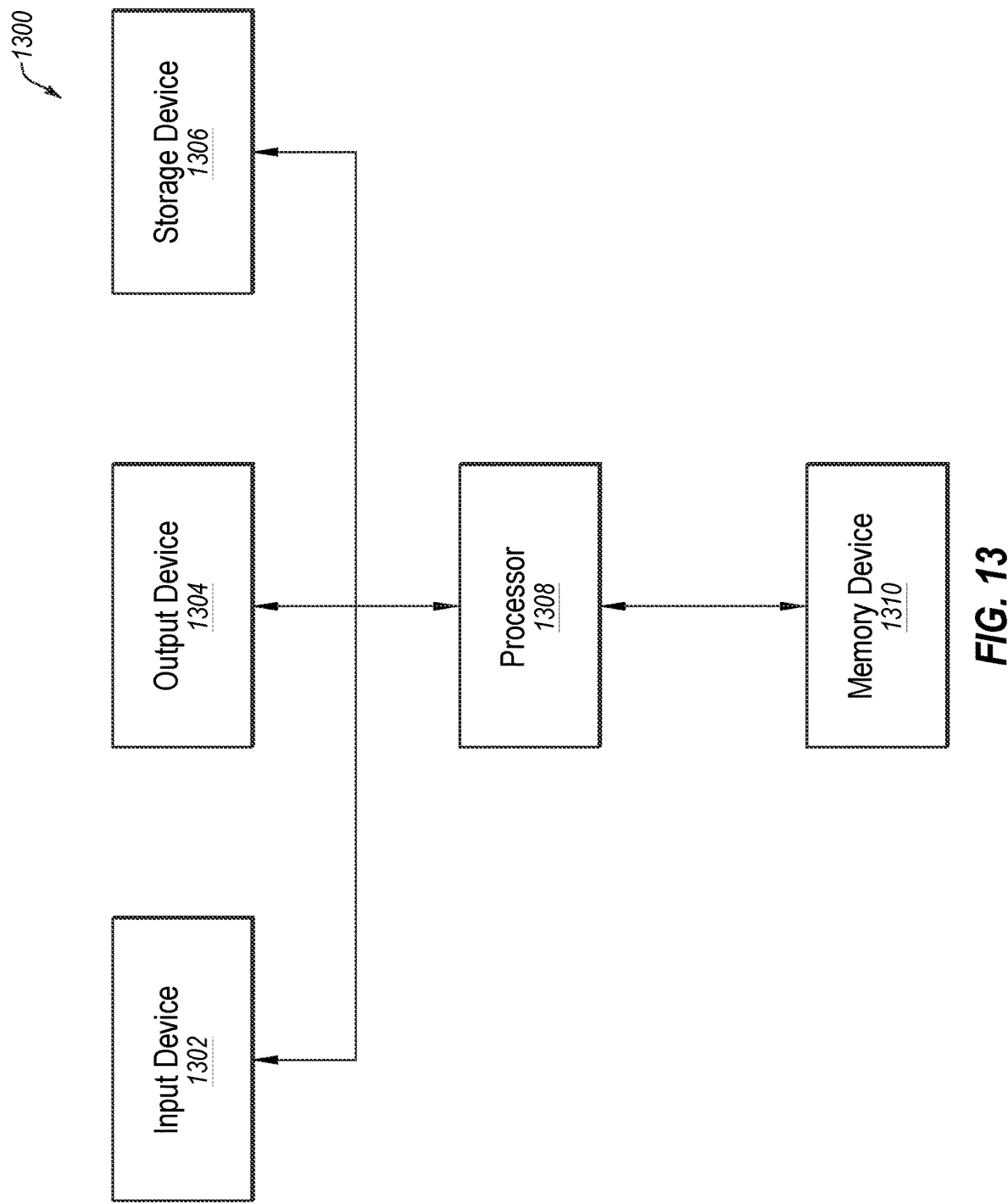

ns include a number of
TRANSMIT LINE MONITORING CIRCUITRY, AND RELATED METHODS, DEVICES, AND SYSTEMS

TECHNICAL FIELD

Embodiments of the disclosure relate to monitoring circuitry. More specifically, various embodiments relate to devices including transmit line monitoring circuitry, and to related methods and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), magnetic random access memory (MRAM), ferroelectric random access memory (FeRAM), double data rate memory (DDR), low power double data rate memory (LPDDR), phase change memory (PCM), and Flash memory.

Memory devices include many memory cells that are configured to hold a charge or other physical state that is representative of a bit of data. Typically, these memory cells are arranged in a memory array. Data may be written to or retrieved from a memory cell by selectively activating the memory cell via an associated word line driver.

BRIEF DESCRIPTION OF THE DRAWINGS

FIG. 13 is a simplified block diagram of an electronic system, in accordance with various embodiments of the present disclosure.

DETAILED DESCRIPTION

As will be appreciated, quality issues with a semiconductor device may arise after fabrication of the semiconductor device. For example, a transmit line (e.g., extending from a fuse array to at least one latch) for transmitting information that is critical to proper functionality of the semiconductor device may degrade and/or become nonfunctional over time.

Various embodiments described herein relate to monitoring fuse and/or testmode information transmitted from a fuse array of a device (e.g., a semiconductor memory device). In some embodiments, each transmit line (also referred to herein as "transmitting line," "transmit lane," or "transmitting lane") may include a monitoring circuit for performing a test on an associated transmit line (e.g., by performing one or more operations on data transmitted from the fuse array via the transmit line). According to various embodiments, each monitoring circuit may be configured to generate a result indicative of a status of an associated transmit line (e.g., whether or not an associated transmit line passed the test). Further, in some embodiments, the device may generate either a pass indicator or a fail indicator at least partially based on the results generated via one or more of the monitoring circuits.

According to some embodiments, one or more monitoring circuits of a device (e.g., semiconductor memory device) may perform a test in response to a power up of the device. More specifically, for example, in response to a power up, data (e.g., fuse and/or testmode information) may be transmitted ("broadcast") to the fuse array (e.g., to program the fuse array). Subsequently, data may be transmitted from the fuse array to a number of monitoring circuits (i.e., via a number of transmit lines) for testing, in accordance with various embodiments disclosed herein.

Although various embodiments are described herein with reference to memory devices, the present disclosure is not so limited, and the embodiments may be generally applicable to microelectronic devices that may or may not include semiconductor devices and/or memory devices. Embodiments of the present disclosure will now be explained with reference to the accompanying drawings.

Figure 1:
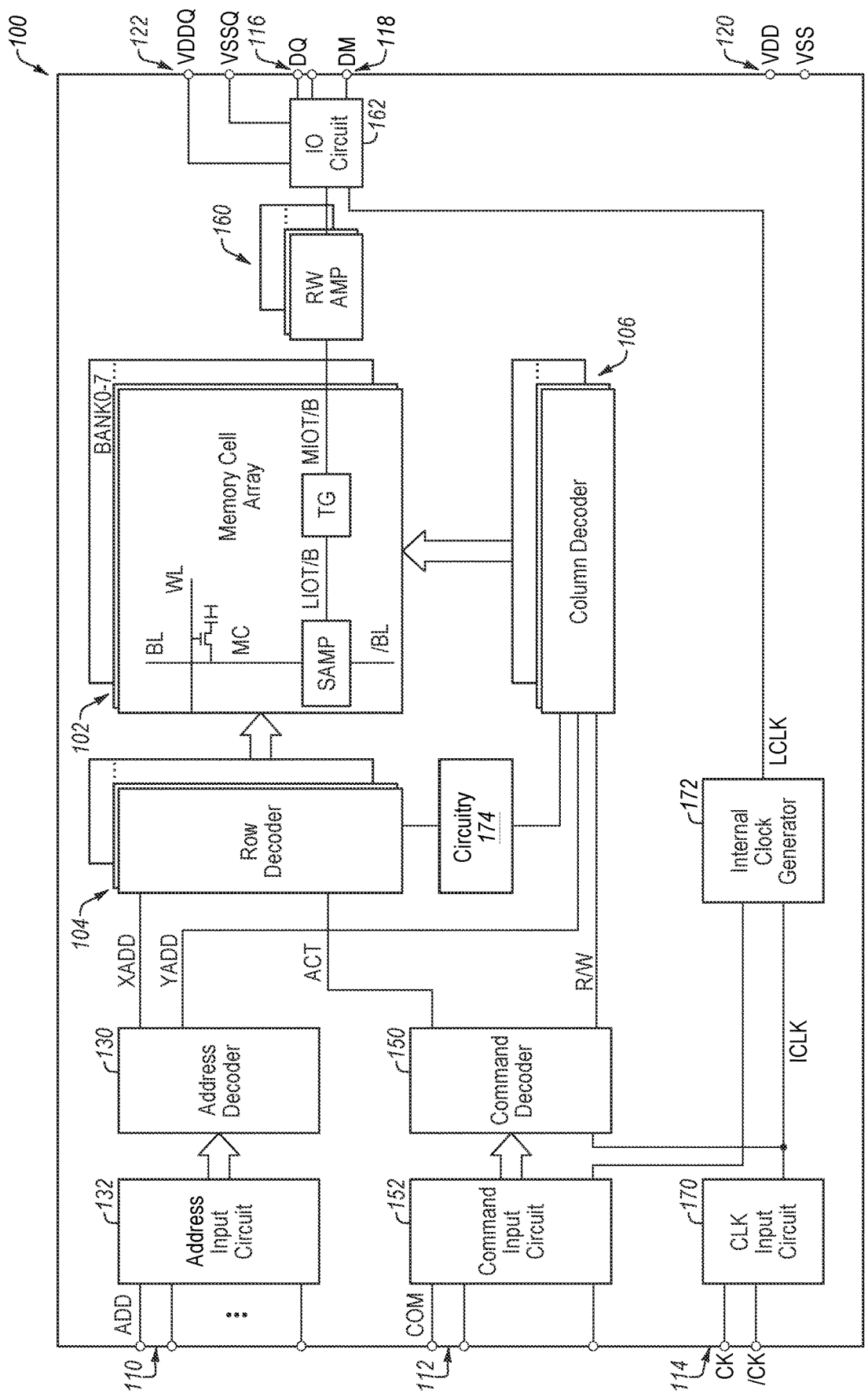
FIG. 1 is a block diagram of an example memory device, according to various embodiments of the present disclosure.

FIG. 1 is a functional block diagram illustrating an example memory device 100, in accordance with at least one embodiment of the present disclosure. Memory device 100 may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), or a SGRAM (synchronous graphics random access memory). Memory device 100, which may be integrated on a semiconductor chip, may include a memory array 102.

In the embodiment of FIG. 1, memory array 102 is shown as including eight memory banks BANK0-7. More or fewer banks may be included in memory array 102 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as a power supply terminal 120 and a power supply terminal 122.

During a contemplated operation, one or more command signals COM, received via command terminals 112, may be conveyed to a command decoder 150 via a command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to the read/write signal R/W, column decoder 106 may be activated, and the bit line BL specified by the column address YADD may be selected.

In response to active command ACT, a read signal, a row address XADD, and a column address YADD, data may be read from the memory cell MC specified by the row address XADD and the column address YADD. The read data may be output via sense amplifier SAMP, transfer gate TG, read/write amplifiers 160, an input/output circuit 162, and data terminals 116. Further, in response to active command ACT, a write signal, a row address XADD, and a column address YADD, write data may be supplied to memory array 102 via data terminals 116, input/output circuit 162, read/write amplifiers 160, transfer gate TG, and sense amplifier SAMP. The write data may be written to the memory cell MC specified by the row address XADD and the column address YADD.

Clock signals CK and /CK may be received via clock terminals 114. A clock input circuit 170 may generate internal clock signals ICLK based on the clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of the input/output circuit 162). Further, data mask terminals 118 may receive one or more data mask signals DM. When data mask signal DM is activated, overwrite of corresponding data may be prohibited.

In some embodiments, memory device 100 may also include circuitry 174, which, in some embodiments, may be coupled to one or more address decoders, such as address decoder 130, row decoder 104, and/or column decoder 106. In some embodiments, circuitry 174, or parts thereof, may be included in one or more of address decoder 130, row decoder 104 and/or column decoder 106. Additionally or alternatively, address decoder 130, row decoder 104 and/or column decoder 106 may be configured to perform one or more operations described with regard to circuitry 174. Additionally or alternatively, address input circuit 132 may include one or more elements of circuitry 174 and/or may be configured to perform one or more operations described with regard to circuitry 174.

Circuitry 174 may be configured to repair defective memory cells of memory array 102. For example, circuitry 174 may be configured to replace a defective memory cell of memory array 102 with a redundant memory cell of memory array 102. More specifically, circuitry 174 may be configured to cause the redundant memory cell to be accessed in response to an operation that includes an address of the defective memory cell (i.e., instead of the defective memory cell). In the present disclosure, the term "repair" may refer to causing a redundant memory cell (or a group of redundant memory cells) to be accessed instead of a defective memory cell (or a group of memory cells including one or more defective memory cells).

Circuitry 174 may include fuses, anti-fuses, and/or latch circuits configured to store trimming information, timing information, and/or replacement information (e.g., locations of defective memory cells, locations of redundant memory cells, and/or associations between redundant memory cells and defective memory cells). In some embodiments, memory device 100 may include fuses in one location of memory device 100 and may include one or more latch circuits located in other locations of memory device 100. The latch circuits may include latches configured to latch states of the fuses. In the present disclosure, the term "latch" may be used to refer to a latch circuit.

Circuitry 174 may be configured to determine whether an operation address (e.g., a row address XADD and/or a column address YADD) associated with a command (e.g., ACT and/or R/W) addresses a defective memory cell for which a repair (e.g., a redundant memory cell) has been identified. Circuitry 174 may be configured to cause memory device 100 (e.g., through row decoder 104 and/or column decoder 106) to access the redundant memory cell rather than the defective memory cell.

Further, according to various embodiments, circuitry 174 may include a number of monitoring circuits (also referred to herein as "test circuits"), wherein each monitoring circuit is configured to perform a test on an associated transmit line, as described more fully below. As described below, in at least some embodiments, each monitoring circuit may include a number of latches (e.g., fuse latches, testmode latches, token latches, without limitation) and logic (e.g., for performing one or more logic operations on data).

Figure 2:
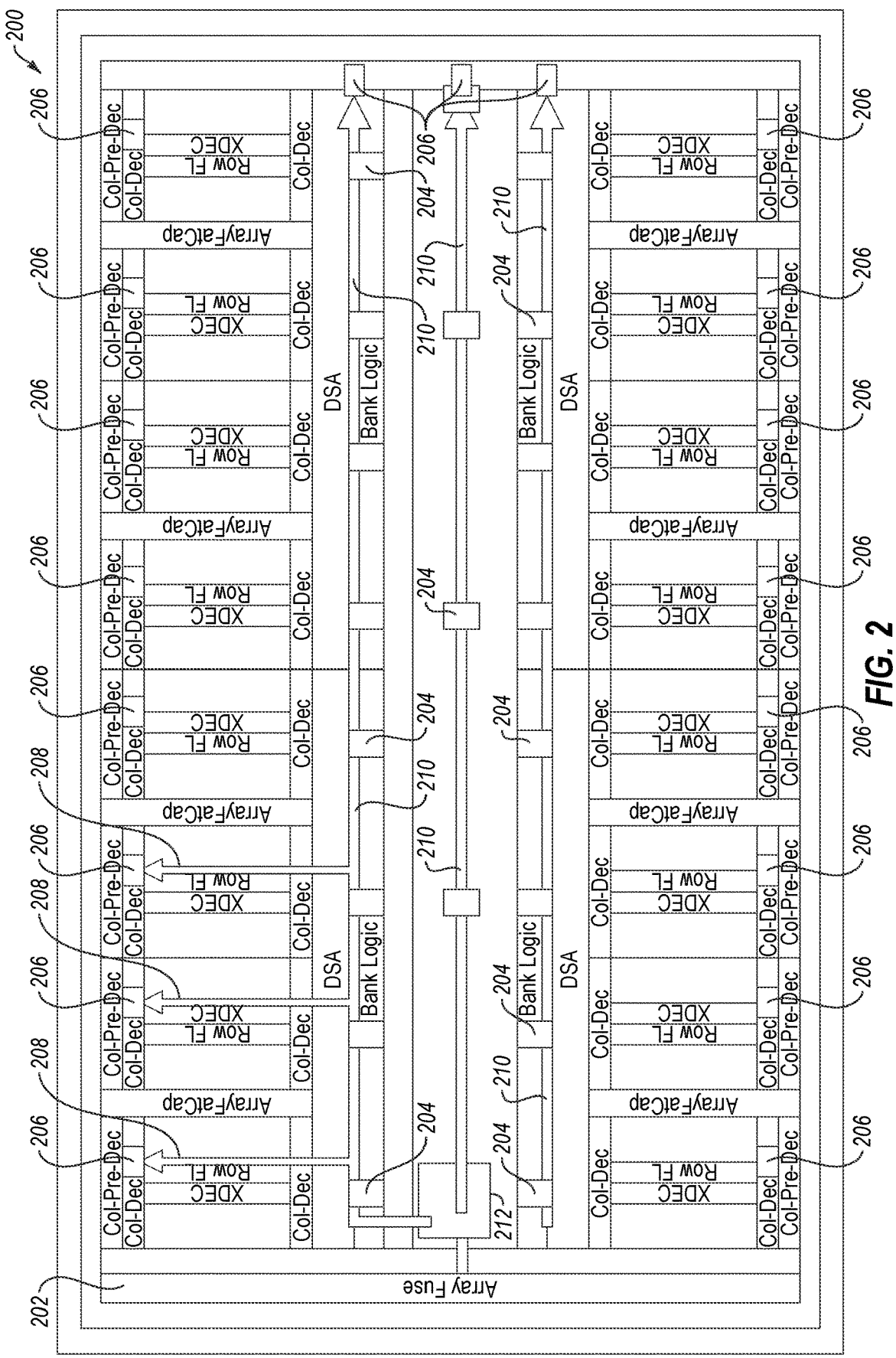
FIG. 2 depicts a portion of an example memory device including a fuse array, a number of transmit lines, and a number of monitoring circuits, according to various embodiments of the present disclosure.

FIG. 2 illustrates a memory device 200, according to various embodiments of the present disclosure. Memory device 200, which may include, for example, a DRAM, includes a fuse array 202, a number of receiver latches 204, and a number of monitoring blocks 206. In some embodiments, each monitoring block (also referred to herein as "monitoring circuit") 206 may include a receiver latch.

Fuse array 202 may be configured to store operating information for memory device 200. In some cases, the operating information may include information for adjusting operating parameters of memory device 200. For example, fuse array 202 may include repair information (e.g., used to indicate that particular rows, columns, or plate lines are defective or associated with defective memory), timing information, and/or trimming information, as will be appreciated by a person having ordinary skill in the art.

Further, memory device 200 includes transmit lines 208 and 210. Transmit lines 208 and 210, which individually or collectively may be one or more buses, may be configured to uni-directionally or bi-directionally communicate the operating information to and from fuse array 202. In some cases, the process of distributing the data stored in fuse array 202 throughout memory device 200 may be referred to as "broadcasting."

According to various embodiments, transmit lines 208, which couple to monitoring blocks 206 proximate a top and a bottom of memory device 200 (i.e., as depicted in FIG. 2), may include fuse transmit lines. Further, transmit lines 210, which couple to monitoring blocks 206 proximate a right side of memory device 200 (i.e., as depicted in FIG. 2), may include testmode (TM) transmit lines. As non-limiting examples, transmit line 208 may include a 16-bit bus, and transmit line 210 may include a 30-bit bus. According to various embodiments, a number of transmit lines (e.g., each transmit line) of memory device 200 includes a monitoring block 206 positioned at or near an end thereof. In other words, a monitoring circuit may be positioned near or at the end of an associated transmit line. It is noted that although FIG. 2 does not illustrate a transmit line for each monitoring block 206, according to some embodiments, each monitoring block 206 may have a transmit line coupled thereto.

Memory device 200 may further include circuitry (e.g., transmit logic 212) configured to process and distribute the information stored in fuse array 202 to the appropriate locations throughout memory device 200. Memory device 200 further includes circuitry, which may include, for example, command/address/control circuits (e.g., Col-Pre-Dec, Col-Dec, XDEC, Row FL). Memory device 200 further includes other circuits, such as data sense amplifiers (DSA) and bank logic. Further, for example, fuse array 202, receiver latches 204, monitoring blocks 206, transmit lines 208, transmit lines 210, and/or other elements shown in FIG. 2 may be part of, or may be coupled to, circuitry 174 of FIG. 1.

As will be described more fully below, in response to an event (e.g., a power up) each monitoring block 206 of memory device 200 may be configured to generate a result (i.e., indicative of either a pass status or a fail status) for an associated transmit line. Further, as described more fully below, if each monitoring block 206 generates a "pass" result, an internal flag of memory device 200 may be set (e.g., via an AND gate or other logic) to indicate a pass. Otherwise, if at least one monitoring block 206 generates a "fail" result, an internal flag of memory device 200 may be set (e.g., via an AND gate or other logic) to indicate a fail.

Figure 3:
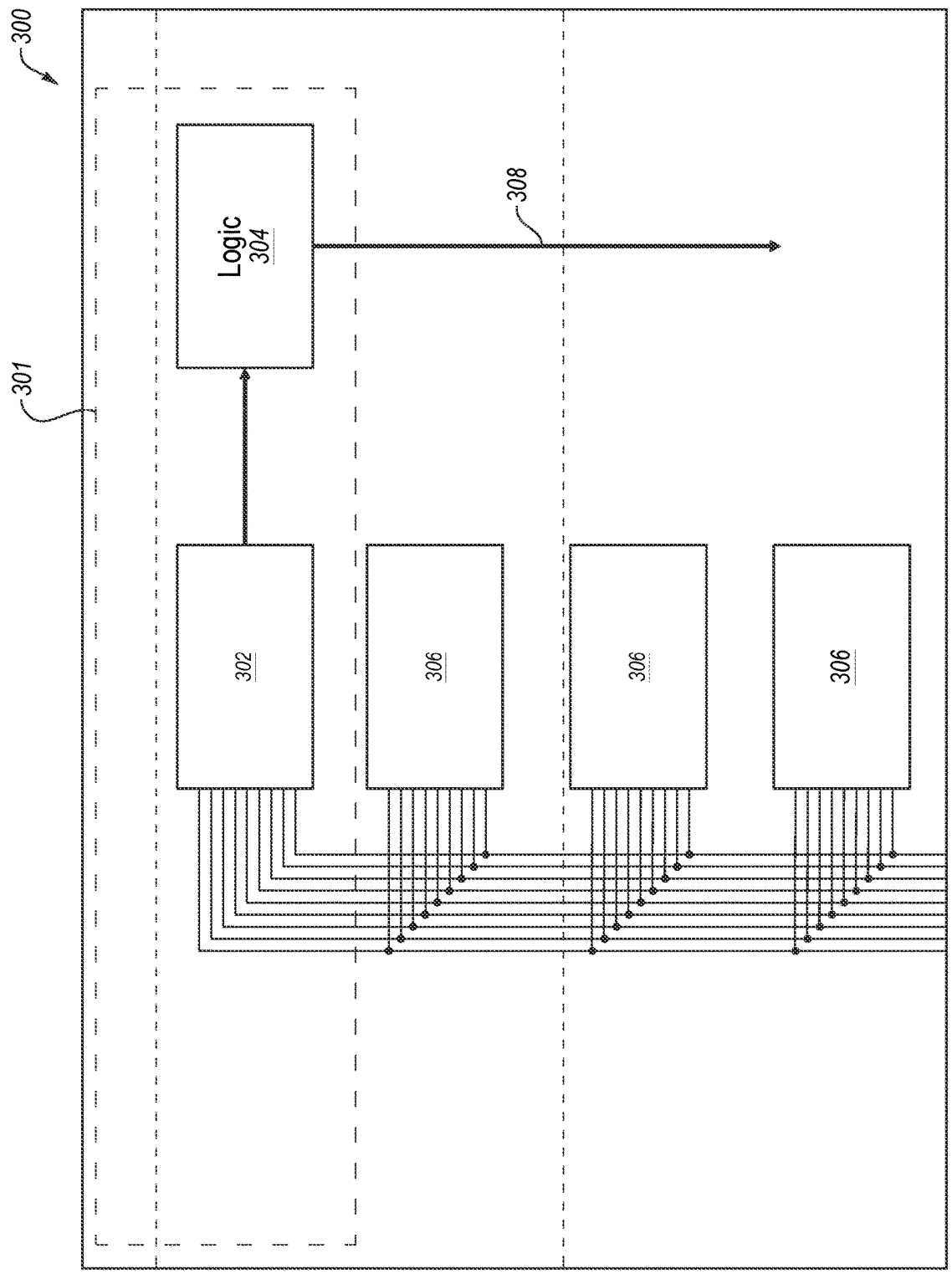
FIG. 3 illustrates another example memory device including a monitoring circuit, according to various embodiments of the present disclosure.

FIG. 3 depicts a portion of an example memory device 300 including a monitoring circuit 301, according to various embodiments of the present disclosure. Monitoring circuit 301 includes a latch (e.g., fuse latch) circuit 302, which may include a number of fuse latches (not shown in FIG. 3; see e.g., FIG. 4). Latch circuit 302 is coupled to logic 304. Memory device 300 further includes a number of redundancy latches 306.

According to some embodiments, latch circuit 302 may be configured to receive data from a fuse array (e.g., fuse array 202 of FIG. 2) via an associated transmit line (e.g., transmit line 208 or transmit line 210 of FIG. 2). Latch circuit 302 may further be configured to convey the data to logic 304. Further, logic 304 may be configured to receive the data from latch circuit 302, perform one or more logic operations on the data, and generate a result 308, which may be indicative either a pass status or a fail status for the associated transmit line.

Figure 4:
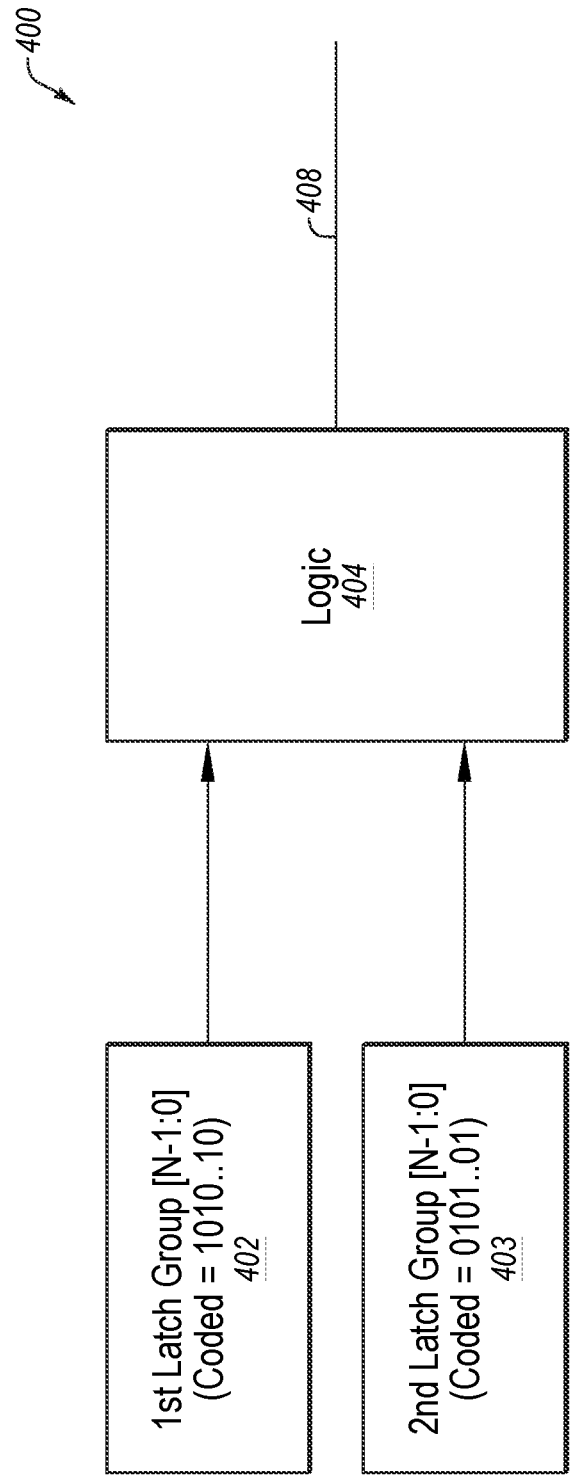
FIG. 4 depicts a portion of an example monitoring circuit, in accordance with various embodiments of the present disclosure.

FIG. 4 depicts an example monitoring circuit 400, in accordance with one or more embodiments of the present disclosure. Monitoring circuit 400 includes a first latch group 402 and a second latch group 403. For example, latch circuit 302 of FIG. 3 may include latch group 402 and latch group 403. Monitoring circuit further includes logic 404, which may include or may be part of logic 304 (see FIG. 3).

According to some embodiments, a memory device may include circuitry for writing test data to a number of fuses (e.g., for a fuse-data bus monitor check). Further, according to some embodiments, a memory device may be configured to force a data bus to a specific pattern (e.g., for lines that are only used for testmodes).

As noted above, in response to an event (e.g., a power up), predetermined data (e.g., fuse and/or testmode information) may be transmitted ("broadcast") from a fuse array (e.g., fuse array 202 of FIG. 2) of a memory device. For example, a first number of bits and a second number of bits may be transmitted from the fuse array via circuitry 174 or other circuitry shown in FIG. 1. For example, the first number of bits may include a bit sequence beginning with a HIGH value and alternating between HIGH and LOW values. Further, the second number of bits may include a bit sequence beginning with a LOW value and alternating between LOW and HIGH values. More specifically, for example, a first number of bits (e.g., 16 bits) that may include a predetermined data sequence (e.g., 101010 . . . 10) and a second number of bits (e.g., 16 bits) that may include another predetermined data sequence (e.g., 010101 . . . 01) may be conveyed from the fuse array (e.g., in response to a power up). Further, to test a number of transmit lines of the memory device, data from the fuse array may be read and transmitted to a number of monitoring circuits via associated transmit lines.

Continuing with this example, if a transmit line is functioning properly, latch group ("1$^{st}$ latch group") 402 may receive and include the first number of bits (e.g., 101010 . . . 10), and latch group ("2$^{nd}$ latch group") 403 may receive and include the second number of bits (e.g., 010101 . . . 01). In this example, latch group 402 may convey the bit sequence "101010 . . . 10" to logic 404, and latch group 403 may convey the bit sequence "0101010 . . . 01" to logic 404. In this example, as described more fully below with reference at least FIGS. 5 and 6, because the bits in latch group 402 and the bits in latch group 403 match the bits transmitted from the fuse array, logic 404 may be configured to generate a result 408 (e.g., a HIGH bit) that is indicative of a pass status.

Figure 5:
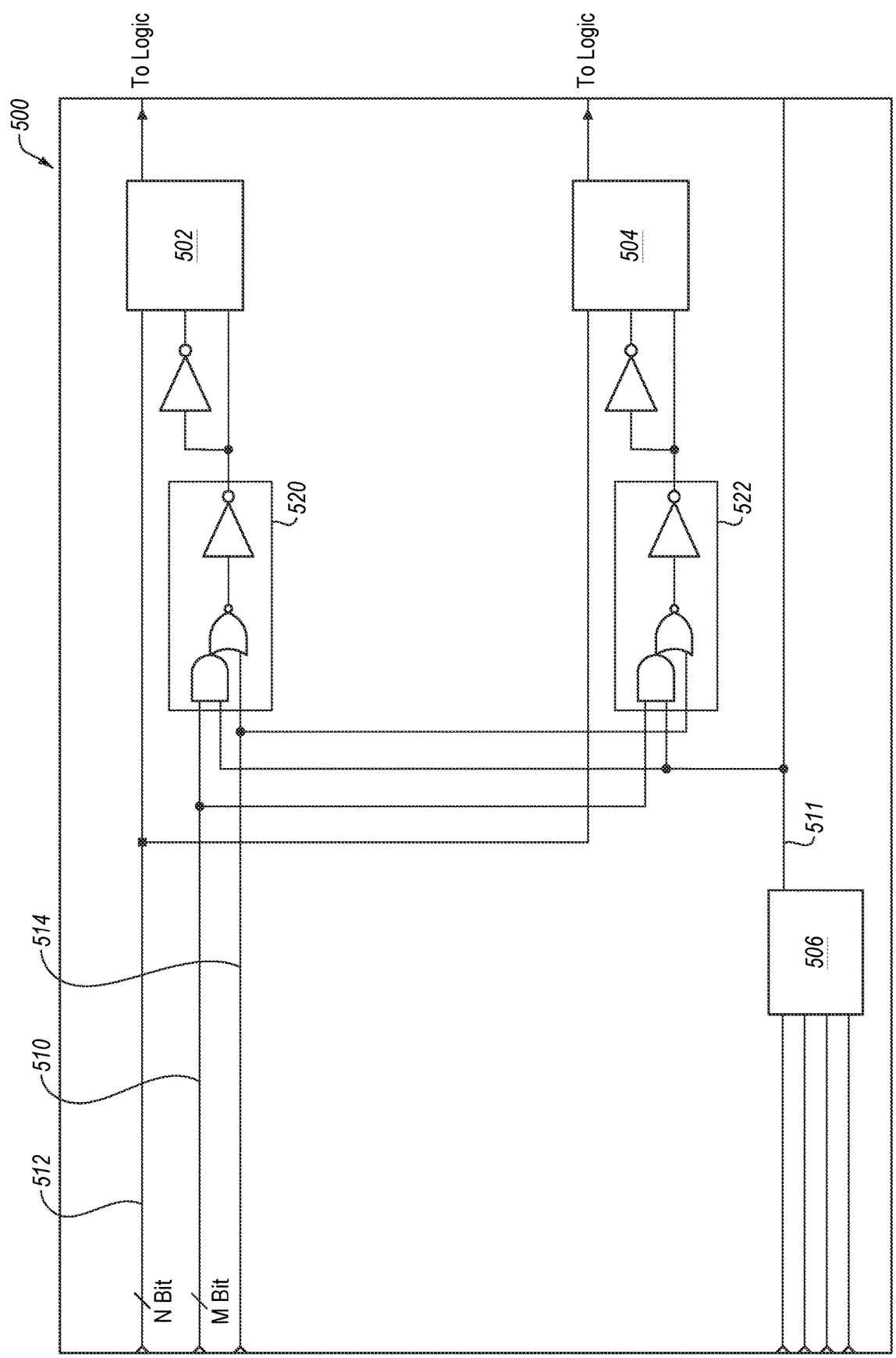
FIG. 5 illustrates example latch circuitry, according to various embodiments of the present disclosure.

FIG. 5 depicts an example latch circuitry 500, according to various embodiments of the present disclosure. Latch circuitry 500 includes fuse latches 502 and 504. In some examples, latch circuitry 500 may also include a load token (e.g., pointer) 506 configured to generate a token signal 511. Latch circuitry 500 also includes a signal line 510 (e.g., including an M (e.g., 2 bit) bus) for selecting (e.g., for loading) either fuse latch 502 or fuse latch 504, a signal line 512 (e.g., including a N (e.g., 16) bit bus) for receiving data (e.g., data "fuse data" from a fuse array), and a signal line 514 for receiving one or more reset signals. According to some embodiments, signal line 510 includes two (2) bits that pulse at different times such that either latch 502 or latch 504 may be selected. Latch circuitry 500 further includes logic 520 and logic 522, wherein each of logic 520 and logic 522 is configured to receive signals via signal lines 510 and 514, and convey signals to an associated fuse latch (i.e., for selecting or resetting the fuse latch). Logic 520 and 522 are provided as example logic configurations, and other configurations and/or implementations may be within the scope of the disclosure.

During a contemplated operation of latch circuitry 500, fuse latch 502 may be selected (i.e., via signal line 510 and token signal 511) and fuse data (e.g., N bits (e.g., 16 bits)) may be received at fuse latch 502. Assuming an associated transmit line is functioning properly and the bit sequence "101010 . . . 10" was transmitted from the fuse array, the fuse data received at fuse latch 502 may include the bit sequence "101010 . . . 10". Continuing with this contemplated operation, fuse latch 504 may be selected (i.e., via signal line 510) and fuse data (e.g., N bits (e.g., 16 bits)) may be received at fuse latch 504. Assuming the associated transmit line is functioning properly and the bit sequence "010101 . . . 01" was transmitted from the fuse array, the fuse data received at fuse latch 504 may include the bit sequence "010101 . . . 01". Further, data (e.g., the bit sequence "101010 . . . 10") may be transmitted from fuse latch 502 to additional logic (e.g., logic 404 of FIG. 4 and/or logic 600 of FIG. 6) and data (e.g., the bit sequence "010101 . . . 01") may be transmitted from fuse latch 504 to the additional logic (e.g., logic 404 of FIG. 4 and/or logic 600 of FIG. 6). More specifically, for example, during one moment (e.g., during a first time period), fuse latch 502 may transmit data (e.g., 16 bits) to additional logic (e.g., logic 404 of FIG. 4 and/or logic 600 of FIG. 6), and subsequently, during another moment (e.g., during a second time period), fuse latch 504 may transmit data (e.g., 16 bits) to the additional logic (e.g., logic 404 of FIG. 4 and/or logic 600 of FIG. 6).

Figure 6:
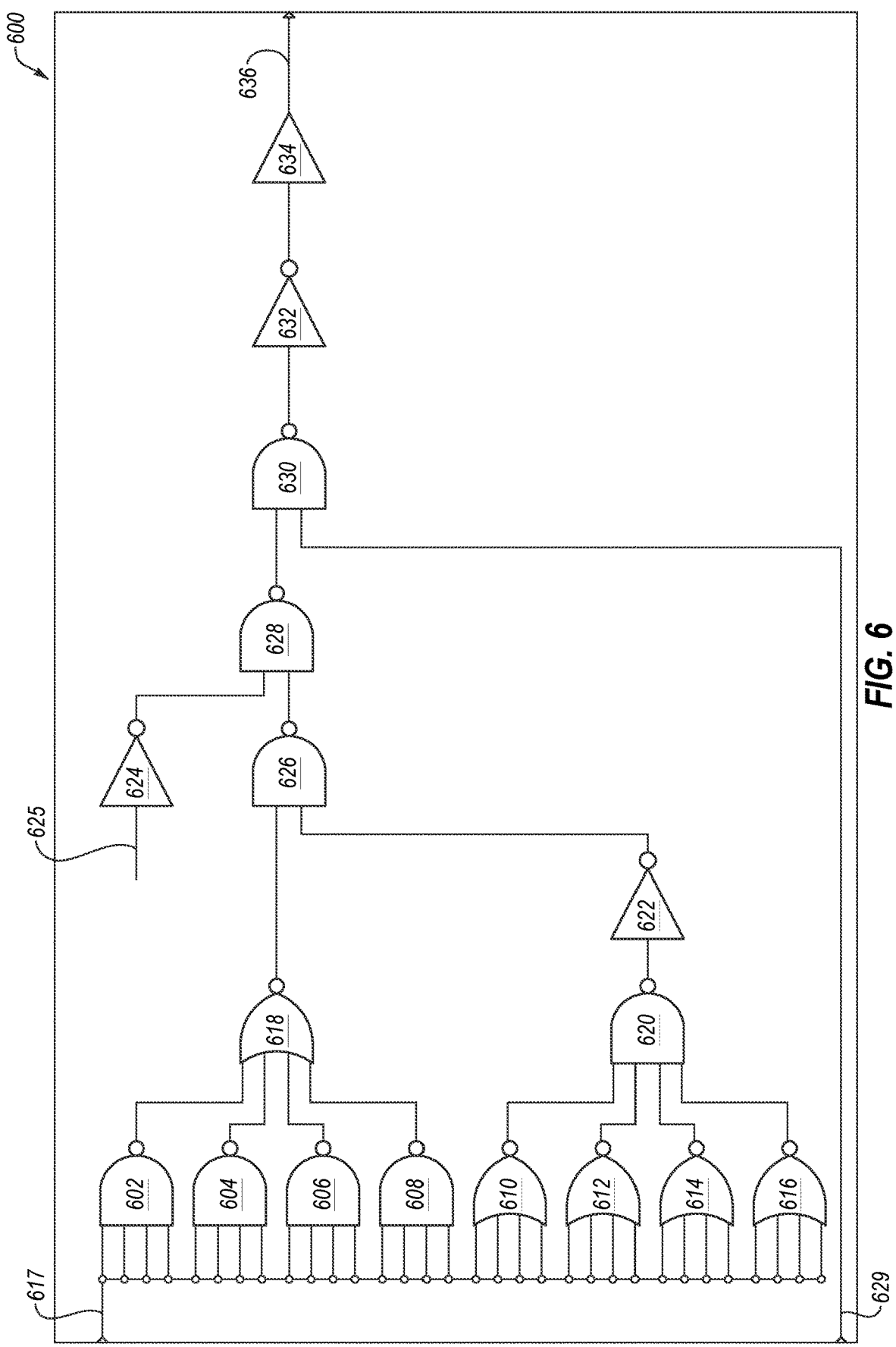
FIG. 6 depicts example logic of a monitoring circuit, according to various embodiments of the present disclosure.

FIG. 6 depicts example logic 600 for receiving fuse data and generating a result, in accordance with various embodiments of the present disclosure. In one example, logic 404 of FIG. 4 may include logic 600. Logic 600 is configured to receive a number of bits (e.g., N bits (e.g., 16 bits) from fuse latch 502 of FIG. 5 and N bits (e.g., 16 bits) from fuse latch 504 of FIG. 5). More specifically, for example, during one instance, logic 600 may receive N bits via signal 617 (e.g., from fuse latch 502 of FIG. 5), and during a second instance (e.g., subsequent to the first instance), logic 600 may receive another N bits via signal 617 (e.g., from fuse latch 504 of FIG. 5).

Logic 600 includes NAND gates 602, 604, 606, and 608, and NOR gates 610, 612, 614, and 616 configured to receive input bits (e.g., N*2 bits) from fuse latches 502 and 504 of FIG. 5 via signal 617. More specifically, NAND gates 602, 604, 606, and 608 are each configured to receive a number of bits (e.g., 4 bits), and NOR gates 610, 612, 614, and 616 are each configured to receive a number of bits (e.g., 4 bits). According to some embodiments, assuming that an associated transmit line is functioning properly and that the fuse array was programmed with bit sequences "101010 . . . 10" and "010101 . . . 01, each of NAND gates 602, 604, 606, and 608 may receive a HIGH bit, and each of NOR gates 610, 612, 614, and 616 may receive a LOW bit.

Logic 600 further includes NOR gate 618, NAND gates 620, 626, and 630, inverters 622, 624, and 632, and a buffer 634. NOR gate 618 is coupled to outputs of NAND gates 602, 604, 606, and 608, and NAND gate 620 is coupled to outputs of NOR gates 610, 612, 614, and 616. An output of NAND gate 620 is coupled to an input of inverter 622, and an output of inverter 622 is coupled to an input of NAND gate 626. An output of NOR gate 618 is coupled to another input of NAND gate 626. An input of inverter 624 is configured to receive a signal 625. Signal 625 may be set HIGH in response to an error, otherwise signal 625 is LOW. An output of NAND gate 626 is coupled to an input of NAND gate 628, and an output of inverter 624 is coupled to another input of NAND gate 628.

An output of NAND gate 628 is coupled to an input of NAND gate 630, and another input of NAND gate 630 is configured to receive an output of another monitoring circuit via a signal 629. An output of NAND gate 630 is coupled to an input of inverter 632, and an output of inverter 632 is coupled to an input of buffer 634. Buffer 634 may generate a status signal 636 indicative of whether or not the transmit lines of a device have passed a test.

Figure 10A:
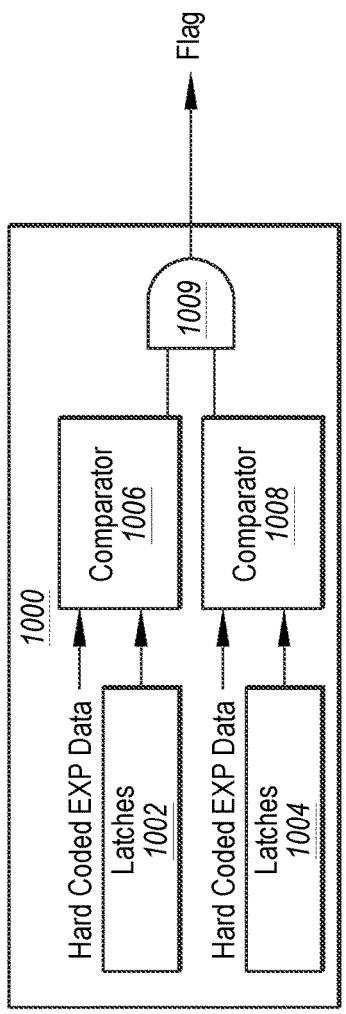
FIGS. 10A-10C depict various example logic circuits for performing one or more logic operations on fuse data, in accordance with various embodiments of the present disclosure.
Figure 10B:
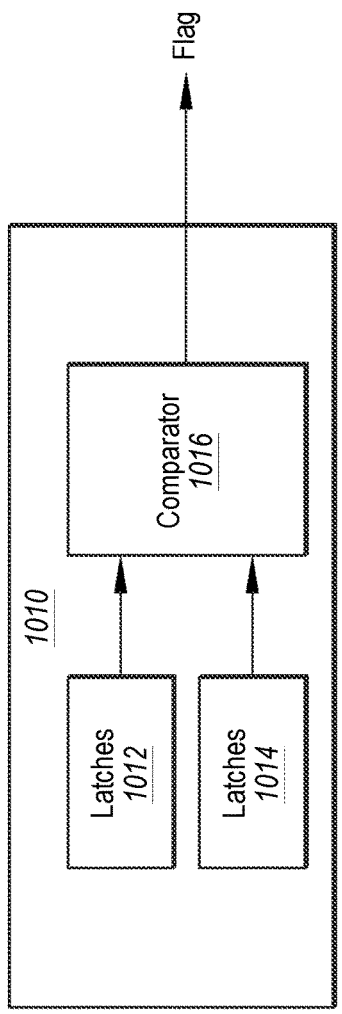
Figure 10C:
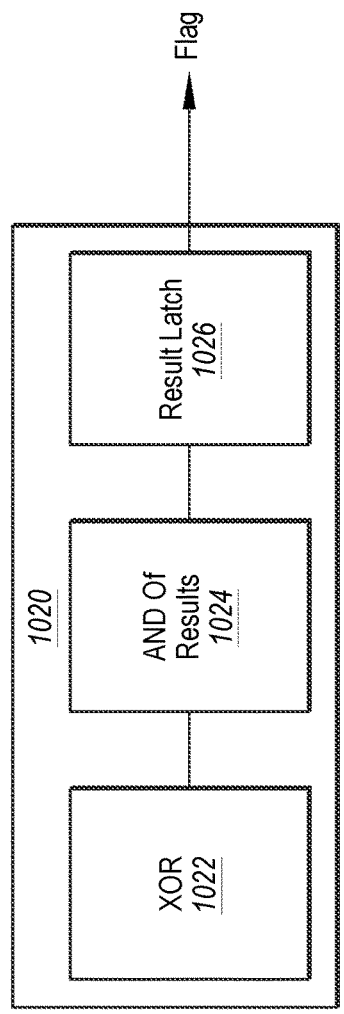

It is noted that because the embodiment illustrated in FIG. 6 is configured such that an output of logic of one monitoring circuit is provided as an input to logic of another monitoring circuit, a result generated by a monitoring circuit may be depend on a status (i.e., a fail or pass status) of another monitoring circuit. More specifically, in an example including ten (10) monitoring circuits (i.e., tested sequentially from 1-10), wherein monitoring circuits 1-6 and 8-10 passed a test, and monitoring circuit 7 failed a test, monitoring circuits 1-6 may generate a result indicative of a pass, and monitoring circuits 7-10 may generate a result indicative of a fail. In other embodiments, outputs of each monitoring circuit may be processed to generate either pass indicator (i.e., if each transmit line of a device passed a test) or a fail indicator (i.e., if at least one transmit line of the device failed a test). More specifically, in at least one embodiment (e.g., as shown in FIG. 10C), outputs of each monitoring circuit may be conveyed to an AND gate, which may generate a pass indicator or a fail indicator.

During a contemplated operation of logic 600, assuming that an associated transmit line is functioning properly (i.e., the correct data is sent from a fuse array to logic 600), each of NAND gates 602, 604, 606, and 608 may receive a HIGH bit, and each of NOR gates 610, 612, 614, and 616 may receive a LOW bit. Further, based on the logic operations performed via the logic gates of logic 600, status signal 636 may be HIGH indicating a pass. On the other hand, if an associated transmit line is not functioning properly (e.g., incorrect data is sent from a fuse array to logic 600), status signal 636 may be LOW indicating a fail.

As noted above with reference to FIG. 2, transmit lines 208 may include fuse transmit lines, and other transmit lines 210 include testmode (TM) transmit lines. Embodiments described above with reference to FIGS. 3-6 may relate to data transmit lines (e.g., fuse data transmit lines and/or TM transmit lines). Further, some embodiments specifically related to TM monitoring circuits are described below with reference to FIGS. 7-9.

Figure 7:
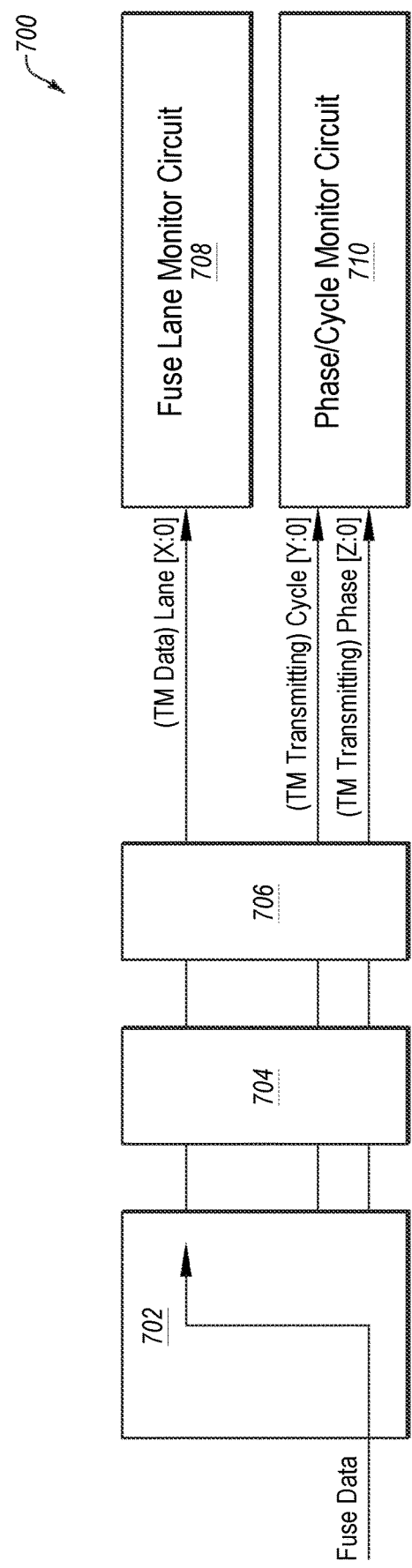
FIG. 7 is a block diagram of an example testmode transmit line monitor, in accordance with various embodiments of the present disclosure.

FIG. 7 is a block diagram of an example TM transmit line monitor 700, according to various embodiments of the present disclosure. Transmit line monitor 700 includes a TM transmitter 702, a TM receiver 704, a TM receiver 706, a fuse lane monitoring circuit 708, and a phase/cycle monitoring circuit 710. As will be appreciated by a person having ordinary skill in the art, data signals along with phase signals and/or cycle signals may be transmitted (e.g., from TM transmitter 702) (e.g., on a common bus). Further, according to various embodiments, data signals along with phase signals and/or cycle signals be received at TM transmit line monitor 700.

According to various embodiments, in response to an event (e.g., a power up), data signals ("TM Data") may be sent to from a fuse array to fuse lane monitoring circuit 708 via a transmit lane ("Lane"). For example, fuse lane monitoring circuit 708 may comprise a monitoring circuit, such as monitoring circuit 301 described above. Thus, fuse lane monitoring circuit 708 may be configured to receive data (e.g., from a fuse array) and perform one or more logic operations on the received data to generate a result indicative of a state (e.g., a pass or fail) of the transmit lane. Further, phase signals may be sent to phase/cycle monitoring circuit 710 via another transmit lane ("Cycle"), and cycle signals may be sent to phase/cycle monitoring circuit 710 via a yet another transmit lane ("Phase").

Figure 8:
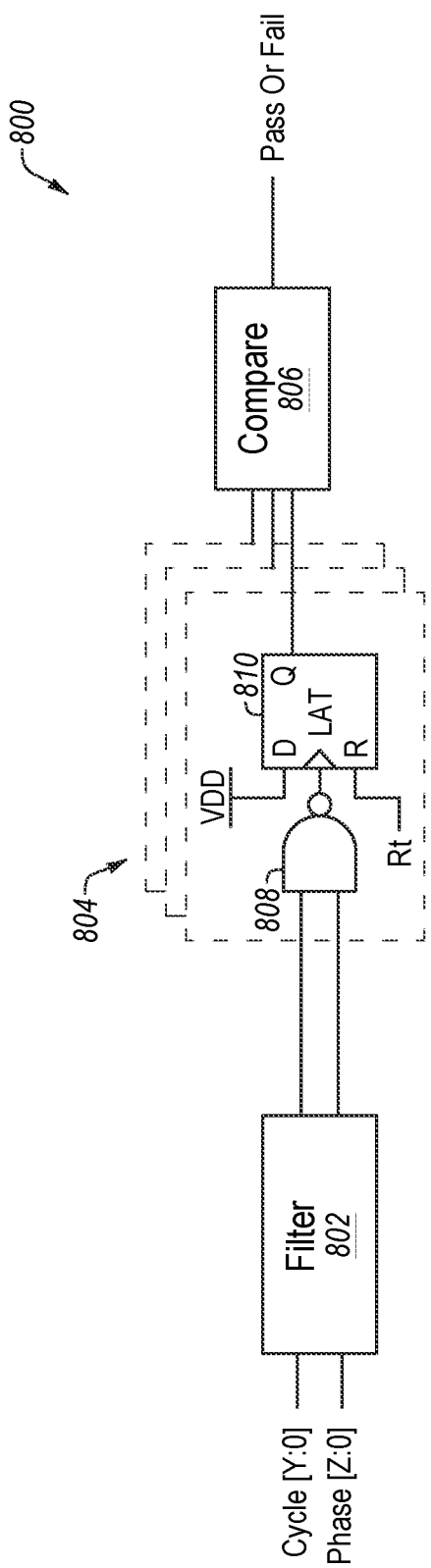
FIG. 8 depicts example circuitry for monitoring testmode control lines, according to various embodiments of the present disclosure.

FIG. 8 depicts example circuitry 800 for monitoring control lines (e.g., cycles and/or phases of TM transmit lines), in accordance with various embodiments of the present disclosure. Generally, circuitry 800 is configured to determine whether the cycles and phase of control lines are toggling correctly. Circuitry 800, which may be part of phase/cycle monitoring circuit 710, includes a filter (e.g., a "stuck high" filter) 802, a number of (e.g., 32) monitoring latches 804, and a compare circuit 806. Each monitoring latch 804 includes a NAND gate 808 coupled to a latch 810. Circuitry 800 is configured to receive a cycle signal (e.g., including 4 bits) and a phase signal (e.g., including 8 bits).

Figure 9:
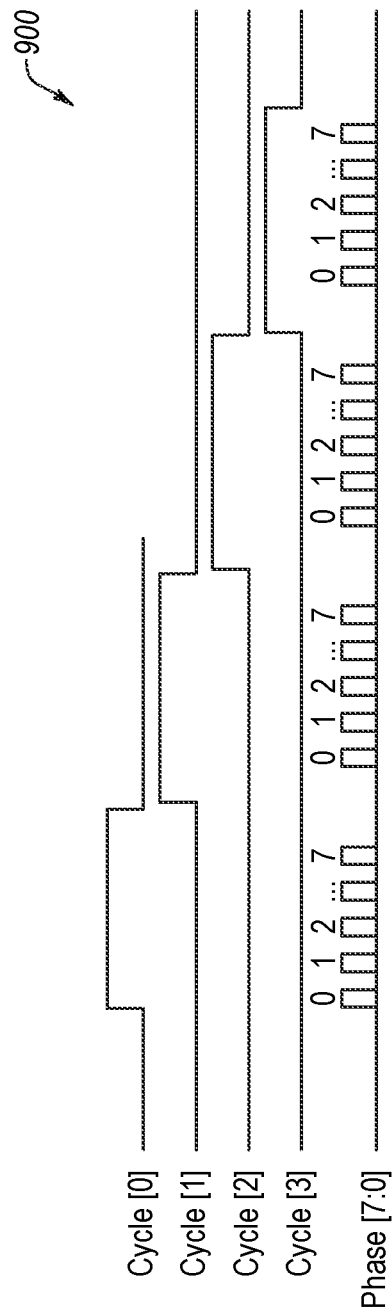
FIG. 9 is a timing diagram depicting various cycle and phase signals shown in FIG. 8.

FIG. 9 is a timing diagram 900 depicting various stages of the cycle and phase signals provided to circuitry 800 of FIG. 8. During operation of circuitry 800, initially, latch 810 is set to LOW, and assuming each phase toggles high for each cycle, each monitoring latch 804 may generate a first signal (e.g., a HIGH signal), which may indicate a pass. In other words, monitoring latch 804 is configured to generate a signal (e.g., a HIGH signal) in response to a cycle and phase combination. Otherwise, if each phase does not toggle high for each cycle, at least one monitoring latch may generate a second signal (e.g., a LOW signal), which may indicate a fail. Further, compare circuit 806, which may include one or more logic gates (e.g., an AND gate), may generate a pass indicator (e.g., a HIGH signal) if each monitoring latch 804 generated the first signal (e.g., a HIGH signal). Further, compare circuit 806 may generate a fail indicator if at least one monitoring latch 804 generated the second signal (e.g., a LOW signal).

As noted above with reference to at least FIGS. 3-5, a monitoring circuit may include various latches and logic for performing various operations to monitor transmit lines of a device. FIGS. 10A-10C depict various example logic circuits for performing one or more logic operations on fuse data (e.g., received from a fuse array), in accordance with various embodiments of the present disclosure.

More specifically, FIG. 10A depicts an example logic circuit 1000 including latches 1002 and 1004, comparators 1006 and 1008, and an AND gate 1009. In this example, comparator 1006 may compare expected data (e.g., hard-coded data, such as "010101 . . . 01") to data received from latches 1002. Further, comparator 1008 may compare expected data (e.g., hard-coded data, such as "101010 . . . 10") to data received from latches 1004. Assuming the data in latches 1002 matches associated expected data and the data in latches 1004 matches associated expected data, each of comparator 1006 and 1008 may generate a signal indicative of a pass (e.g., a HIGH signal). Moreover, assuming each of comparator 1006 and 1008 generate a signal indicative of a pass, AND gate 1009 may generate a flag indicative of a pass. In the event the data in latches 1002 does not match associated expected data and/or the data in latches 1004 does not match associated expected data, comparator 1006 and/or comparator 1008 may generate a signal indicative of a fail (e.g., a LOW signal). Moreover, if comparator 1006 and/or comparator 1008 generates a signal indicative of a fail, AND gate 1009 may generate a flag indicative of a fail.

FIG. 10B depicts another example logic circuit 1010 including latches 1012, latches 1014, and a comparator 1016. In this example, comparator 1016, which may include logic 600 of FIG. 6, may be configured to perform a number of logic operations on data received from latches 1012 and 1014. Assuming the data received from latches 1012 and 1014 matches the data transmitted to the fuse array (e.g., "101010 . . . 10" and "010101 . . . 01"), comparator 1016 may generate a flag indicative of a pass. If the data in either of latches 1012 or 1014 does not match the data transmitted to the fuse array (e.g., "101010 . . . 10" and "010101 . . . 01"), comparator 1016 may generate a flag indicative of a fail.

FIG. 10C depicts another example logic circuit 1020 including an XOR gate 1022, an AND circuit 1024, and a result latch 1026. In this example, assuming data transmitted to a fuse array includes a first data set (e.g., "101010 . . . 10") and a second data set (e.g., "010101 . . . 01"), and data transmitted from the fuse array to circuit 1020 matches the data transmitted to the fuse array, XOR gate may generate a number of bits having a first state (e.g., a HIGH state), AND circuit 1024 may generate a signal having the first state, and an output of AND circuit 1024 may be latched via result latch 1026 to generate a flag indicative of a pass. If the data transmitted from the fuse array to circuit 1020 does not match the data transmitted to the fuse array, XOR gate may generate at least one bit having a second state (e.g., a LOW state), AND circuit 1024 may generate a signal having the second state, and an output of AND circuit 1024 may be latched via result latch 1026 to generate a flag indicative of a fail.

For example, circuit 1000 of FIG. 10A may provide enhanced monitoring capability compared to circuit 1020 of FIG. 10C; however, circuit 1020 of FIG. 10C requires less space compared to circuit 1000 of FIG. 10A. Further, circuit 1010 of FIG. 10B may be smaller than circuit 1000 and larger than circuit 1020, while providing more monitoring capability compared to circuit 1020 and less monitoring capability compared to circuit 1000.

Figure 11:
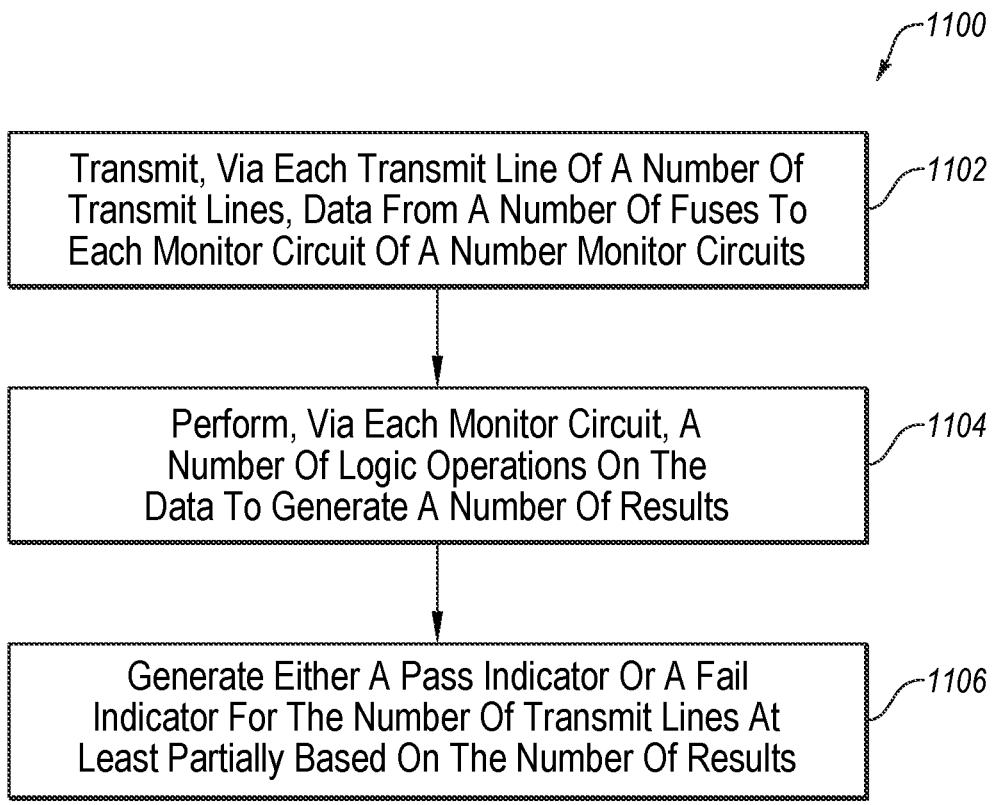
FIG. 11 is a flowchart of an example method of operating a memory device, in accordance with various embodiments of the present disclosure.

FIG. 11 is a flowchart of an example method 1100 of operating a memory device, in accordance with various embodiments of the disclosure. Method 1100 may be arranged in accordance with at least one embodiment described in the present disclosure. Method 1100 may be performed, in some embodiments, by a device or system, such as memory device 100 of FIG. 1, memory device 200 of FIG. 2, memory device 300 of FIG. 3, monitoring circuit 400 of FIG. 4, latch circuitry 500 of FIG. 5, logic 600 of FIG. 6, testmode transmit line monitor 700 of FIG. 7, circuitry 800 of FIG. 8, logic circuits 1000, 1010, and/or 1020 of FIGS. 10A-10C, memory device 1200 of FIG. 12, and/or electronic system 1300 of FIG. 13, or another device or system. Although illustrated as discrete blocks, various blocks may be divided into additional blocks, combined into fewer blocks, or eliminated, depending on the desired implementation.

Method 1100 may begin at block 1102, wherein data from a number of fuses is transmitted, via each transmit line of a number of transmit lines, to each monitoring circuit of a number of monitoring circuits, and method 1100 may proceed to block 1104. For example, each transmit line 208/210 of FIG. 2 may transmit data from fuse array 202 to each monitoring block 206 (see FIG. 2).

At block 1104, a number of logic operations may be performed, via each monitoring circuit, on the data to generate a number of results, and method 1100 may proceed to block 1106. For example, the number of logic operations may be performed via logic 304 of FIG. 3, logic 404 of FIG. 4, logic 600 of FIG. 6, comparator 1006 and/or comparator 1008 of FIG. 10A, comparator 1016 of FIG. 10B, and/or logic circuit 1020 of FIG. 10C.

At block 1106, either a pass indicator or a fail indicator may be generated at least partially based on the number of results. For example, a pass indicator or a fail indicator may be generated via logic 404 of FIG. 4, logic 600 of FIG. 6, fuse lane monitoring circuit 708 of FIG. 7, and/or one or more of logic circuits 1000, 1010, and 1020 of FIGS. 10A-10C.

Modifications, additions, or omissions may be made to method 1100 without departing from the scope of the present disclosure. For example, the operations of method 1100 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein a number of fuses are programmed with test data. Further, for example, a method may include one or more acts wherein one or more logic operations may be performed on phase and cycle signals for a TM transmit line to generate a result and, in some embodiments, an indicator may be generated based on the result.

Figure 12:
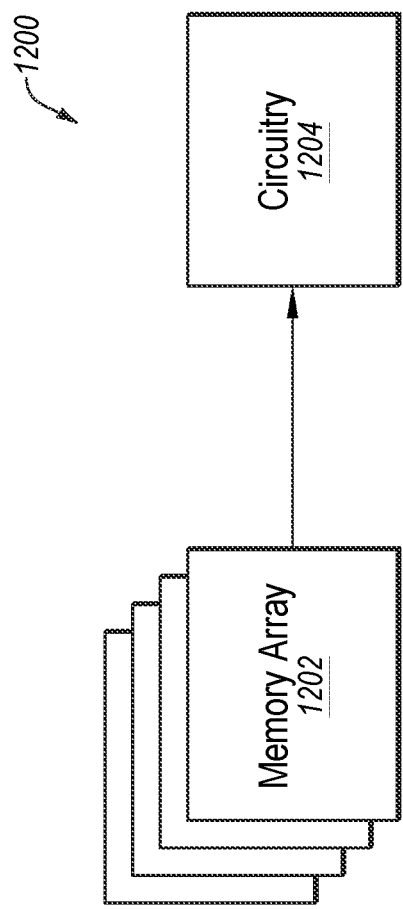
FIG. 12 is a simplified block diagram of a memory device, in accordance with various embodiments of the present disclosure.

A memory system is also disclosed. According to various embodiments, the memory system may include a memory device (e.g., memory device 100 of FIG. 1) including one or more memory cell arrays. FIG. 12 is a simplified block diagram of a memory system 1200 implemented according to one or more embodiments described herein. Memory system 1200, which may include, for example, a semiconductor device, includes a memory array 1202 and circuitry 1204, which may include, for example only, one or more circuits and/or elements illustrated in one or more of FIGS. 1-8 and 10A-10C, as described herein. Memory array 1202, which may include a number of memory banks, may include a number of memory cells. Circuitry 1204, which may be operatively coupled to memory array 1202, may be configured for carrying out one or more embodiments disclosed herein. Memory system 1200 may also include a controller (not shown in FIG. 12) coupled to memory array 1202 and/or circuitry 1204.

A system is also disclosed. According to various embodiments, the system may include a memory device including a number of memory banks, each memory bank having an array of memory cells. Each memory cell may include an access transistor and a storage element operably coupled with the access transistor.

FIG. 13 is a simplified block diagram of an electronic system 1300 implemented according to one or more embodiments described herein. Electronic system 1300 includes at least one input device 1302, which may include, for example, a keyboard, a mouse, or a touch screen. Electronic system 1300 further includes at least one output device 1304, such as a monitor, a touch screen, or a speaker. Input device 1302 and output device 1304 are not necessarily separable from one another. Electronic system 1300 further includes a storage device 1306. Input device 1302, output device 1304, and storage device 1306 may be coupled to a processor 1308. Electronic system 1300 further includes a memory device 1310 coupled to processor 1308. Memory device 1310, which may include memory device 1200 of FIG. 12, may include an array of memory cells. Electronic system 1300 may include, for example, a computing, processing, industrial, or consumer product. For example, without limitation, electronic system 1300 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments disclosed herein may be used to monitor (e.g., via performing one or more testing operations) one or more transmit lines (e.g., of semiconductor memory device) used for transmitting information that may be critical for proper functionality of a device (e.g., a semiconductor memory device). It will be appreciated that monitoring the functionality of transmit lines (e.g., to detect faults and/or errors) may be advantageous in various applications (e.g., automotive, aviation, manufacturing, medical, without limitation). As one non-limiting example, in an automotive application (e.g., an autonomous vehicle application) it may be of utmost importance (e.g., for safety and other reasons) that a memory device, including all transmit lines of the memory device, is functioning properly. In these applications, utilizing one or more embodiments of the present disclosure, a transmit line malfunction may be detected, and possibly remedied (e.g., via replacement and/or utilizing a backup memory device) (e.g., prior to use of a vehicle).

Various embodiments of the present disclosure may include a device. The device may include a number of fuses and a number of transmit lines configured to transmit data from the number of fuses. The device may also include a number of monitoring circuits, wherein each monitoring circuit of the number of monitoring circuit is coupled to a transmit line of the number of transmit lines. Further, each monitoring circuit may include logic configured to receive the data from the number fuses via the transmit line. The logic may also be configured to generate a result responsive to the data and indicative of pass/fail status of the transmit line.

One or more other embodiments of the present disclosure include a method of operating a memory device. The method may include transmitting, via each transmit line of a number of transmit lines, data from a number of fuses to each monitoring circuit of a number monitoring circuits. The method may also include performing, via each monitoring circuit, a number of logic operations on the data to generate a number of results. Further, the method may include generating either a pass indicator or a fail indicator at least partially based on the number of results.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and comprising a number of transmit lines coupled to a number of fuses of the memory device. The memory device may also include logic coupled to each transmit line of the number of transmit lines. The logic may be configured to receive data from a number fuses via a transmit line. The logic may also be configured to generate, for each transmit line, a result responsive to the data and indicative of pass/fail status of the transmit line. Further, the logic may be configured to generate either a pass or a fail flag at least partially based on results generated for each transmit line of the number of transmit lines.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
    a number of fuses;
    a number of transmit lines configured to transmit data from the number of fuses; and
    a number of monitoring circuits, wherein each monitoring circuit of the number of monitoring circuit is coupled to a transmit line of the number of transmit lines, wherein each monitoring circuit comprises logic configured to:
        receive the data from the number fuses via the transmit line; and
        generate a result responsive to the data and indicative of pass/fail status of the transmit line.

2. The device of claim 1, further comprising additional logic configured to generate either a pass indicator or a fail indicator at least partially based on the results generated via the number of monitoring circuits.

3. The device of claim 1, wherein each monitoring circuit further comprises a first latch configured to latch a first group of bits and a second latch configured to latch a second group of bits.

4. The device of claim 1, wherein each monitoring circuit of the number of monitoring circuits is positioned at or near an end of an associated transmit line.

5. The device of claim 1, wherein the number of transmit lines comprises a number of fuse transmit lines and a number of testmode transmit lines.

6. The device of claim 1, wherein each monitoring circuit comprises a phase/cycle monitoring circuit configured to monitor phase and cycle signals for the transmit line.

7. The device of claim 1, further comprising circuitry for writing test data to the number of fuses.

8. The device of claim 7, wherein the test data written to the number of fuses comprises:
   a first group of bits having a bit sequence beginning with a HIGH value and alternating between HIGH and LOW values; and
   a second group of bits having a bit sequence beginning with a LOW value and alternating between LOW and HIGH values.

9. The device of claim 1, further comprising a number of fuse latches, each fuse latch of the number of fuse latches configured to receive a portion of the data from one or more fuses of the number of fuses and transmit the portion of the data to the logic.

10. A method of operating a memory device, comprising:
    transmitting, via each transmit line of a number of transmit lines, data from a number of fuses to each monitoring circuit of a number of monitoring circuits;
    performing, via each monitoring circuit, a number of logic operations on the data to generate a number of results; and
    generating either a pass indicator or a fail indicator at least partially based on the number of results.

11. The method of claim 10, further comprising programming the number of fuses with test data.

12. The method of claim 11, wherein programming the number of fuses with test data comprises:
    programming a first set of the number of fuses with a bit sequence beginning with a HIGH value and alternating between HIGH and LOW values; and
    programming a second set of the number of fuses with a bit sequence beginning with a LOW value and alternating between LOW and HIGH values.

13. The method of claim 11, wherein generating either a pass indicator or a fail indicator comprises:
    generating the pass indicator responsive to the test data matching the data transmitted from the number of fuses to each monitoring circuit of the number of monitoring circuits; and
    generating the fail indicator responsive to the test data not matching the data transmitted from the number of fuses to at least one monitoring circuit of the number of monitoring circuits.

14. The method of claim 10, wherein transmitting the data from the number of fuses to each monitoring circuit of the number of monitoring circuits comprises transmitting the data from the number of fuses to a monitoring circuit positioned at or near an end of an associated transmit line of the number of transmit lines.

15. The method of claim 10, further comprising:
    performing, via at least one monitoring circuit of the number of monitoring circuits, one or more logic operations on phase and cycle signals for a transmit line to generate a second result; and
    generating either a second pass indicator or a second fail indicator based at least partially on the second result.

16. A system comprising:
    at least one input device;
    at least one output device;
    at least one processor device operably coupled to the input device and the output device; and
    at least one memory device operably coupled to the at least one processor device and comprising:
       a number of transmit lines coupled to a number of fuses of the memory device; and
       logic coupled to each transmit line of the number of transmit lines, wherein the logic is configured to:
          receive data from a number of fuses via a transmit line;
          generate, for each transmit line, a result responsive to the data and indicative of pass/fail status of the transmit line; and
          generate either a pass or a fail flag at least partially based on results generated for each transmit line of the number of transmit lines.

17. The system of claim 16, further comprising circuitry for writing test data to the number of fuses, wherein the test data comprises:
    a first number of bits beginning with a HIGH bit and alternating between HIGH and LOW bits; and
    a second number of bits beginning with a LOW bit and alternating between LOW and HIGH bits.

18. The system of claim 17, wherein the data comprises a third number of bits and a fourth number of bits, wherein the logic is configured to generate the result indicative of a pass status responsive to the first number of bits matching the third number of bits and the second number of bits matching the fourth number of bits.

19. The system of claim 16, wherein the logic comprises a number of monitor latches, wherein each monitor latch of the number of monitor latches is configured to generate a first value in response to a unique combination of phase and cycle signals associated with the transmit line.

20. The system of claim 19, wherein the logic further comprises a compare circuit configure to:
    receive a signal from each of the number of monitor latches;
    generate a pass flag responsive to each monitor circuit of the number of monitor latches outputting the first value; and
    generate a fail flag responsive to at least one monitor latch of the number of monitor latches outputting a second value.

* * * * *